United States Patent
Wagganer et al.

(10) Patent No.: US 6,949,460 B2
(45) Date of Patent: Sep. 27, 2005

(54) LINE EDGE ROUGHNESS REDUCTION FOR TRENCH ETCH

(75) Inventors: Eric Wagganer, Fremont, CA (US); Helen H. Zhu, Fremont, CA (US); Daniel Le, Santa Clara, CA (US); Peter Loewenhardt, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 10/712,410

(22) Filed: Nov. 12, 2003

(65) Prior Publication Data

US 2005/0101126 A1 May 12, 2005

(51) Int. Cl.$^7$ .......................................... H01L 21/4763
(52) U.S. Cl. ....................... 438/637; 438/700; 438/714
(58) Field of Search ............................ 438/637, 638, 438/696, 700, 711, 714, 723, 905, 906

(56) References Cited

U.S. PATENT DOCUMENTS

| | | | |
|---|---|---|---|
| 5,658,425 A | 8/1997 | Halman et al. | 438/620 |
| 6,080,680 A | 6/2000 | Lee et al. | 438/727 |
| 6,090,304 A | 7/2000 | Zhu et al. | 216/79 |
| 6,380,096 B2 * | 4/2002 | Hung et al. | 438/723 |
| 6,518,174 B2 | 2/2003 | Annapragada et al. | 438/637 |
| 6,686,293 B2 * | 2/2004 | Kim et al. | 438/711 |

OTHER PUBLICATIONS

Calvin T. Gabriel, et al., "Measuring and Minimizing Line Edge Roughness in BEOL Damascene Dielectric Patterning", 2003 AVS 4th Int'l. Conf. on Microelectronics and Interfaces, Mar. 3–6, Santa Clara, CA, pp. 204–207.

* cited by examiner

*Primary Examiner*—Phuc T. Dang
(74) *Attorney, Agent, or Firm*—Beyer Weaver & Thomas LLP

(57) ABSTRACT

A method for etching a trench to a trench depth in a dielectric layer over a substrate is provided. An ARC is applied over the dielectric layer. A photoresist mask is formed on the ARC, where the photoresist mask has a thickness. The ARC is etched through. A trench is etched into the dielectric layer with a dielectric to photoresist etch selectivity between 1:1 and 2:1.

12 Claims, 7 Drawing Sheets ary feature geometries that block light from propagating through
LINE EDGE ROUGHNESS REDUCTION FOR TRENCH ETCH

BACKGROUND OF THE INVENTION

1. Field of the Invention

The invention relates to a method providing improved line edge for a trench etch for Single and Dual Damascene metal integration.

2. Description of the Related Art

The present invention relates to the formation of semiconductor devices.

During semiconductor wafer processing, features of the semiconductor device are defined in the wafer using well-known patterning and etching processes. In these processes, a photoresist (PR) material is deposited on the wafer and then is exposed to light filtered by a reticle. The reticle is generally a glass plate that is patterned with exemplthe reticle.

After passing through the reticle, the light contacts the surface of the photoresist material. The light changes the chemical composition of the photoresist material such that a developer can remove a portion of the photoresist material. In the case of positive photoresist materials, the exposed regions are removed, and in the case of negative photoresist materials, the unexposed regions are removed. Thereafter, the wafer is etched to remove the underlying material from the areas that are no longer protected by the photoresist material, and thereby define the desired features in the wafer.

Various generations of photoresist are known. Deep ultra violet (DUV) photoresist is exposed by 248 nm light. To facilitate understanding, FIG. 1A is a schematic cross-sectional view of a layer 108 over a substrate 104, with a patterned photoresist layer 112, over an ARC (Anti-reflective coating) 110 over the layer 108 to be etched forming a stack 100. The photoresist pattern has a critical dimension (CD), which may be the width 116 of the smallest feature. Presently, for 248 nm photoresist a typical CD for the photoresist may be 230–250 nm using conventional processes. Due to optical properties dependent on wavelength, photoresist exposed by longer wavelength light has larger theoretical minimal critical dimensions.

A trench 120 may then be etched through the photoresist pattern, as shown in FIG. 1B. In order to provide features with smaller CD, features formed using shorter wavelength light are being pursued. 193 nm photoresist is exposed by 193 nm light. Using phase shift reticles and other technology, a 90–100 nm CD photoresist pattern may be formed, using 193 nm photoresist. This would be able to provide a feature with a CD of 90–100 nm.

The use of shorter wavelength photoresists may provide additional problems over photoresists using longer wavelengths. To obtain CD's close to the theoretical limit the lithography apparatus should be more precise, which would require more expensive lithography equipment. Presently 193 nm photoresist may not have selectivities as high as longer wavelength photoresists and may more easily deform under plasma etch conditions.

In the formation of single and dual damascene structures, a wide trench is etched partially or fully through the dielectric (an M1 etch) to form connecting lines. A narrower via is subsequently etched completely through a dielectric layer to form a contact.

SUMMARY OF THE INVENTION

To achieve the foregoing and in accordance with the purpose of the present invention, a method for etching a trench to a trench depth in a dielectric layer over a substrate is provided. An ARC is applied over the dielectric layer. A photoresist mask is formed on the ARC, where the photoresist mask has a thickness. The ARC is etched through. A trench is etched into the dielectric layer with a dielectric to photoresist etch selectivity between 1:1 and 2:1.

In another manifestation of the invention a method for etching a trench to a trench depth in a dielectric layer over a substrate is provided. An ARC is applied on the dielectric layer. A sensitive photoresist mask is formed on the ARC, with a thickness between about 2000 Å and 4000 Å. The ARC is etched through. A trench is etched into the dielectric layer with a clean etch.

In another manifestation of the invention an apparatus for etching a feature in a dielectric layer is provided. A plasma processing chamber is provided. The plasma processing chamber comprises a chamber wall forming a plasma processing chamber enclosure, a substrate support for supporting a substrate within the plasma processing chamber enclosure, a pressure regulator for regulating the pressure in the plasma processing chamber enclosure, an electrode placed opposite from and spaced apart from the substrate support, a heater connected to the electrode for heating the electrode, a gas inlet for providing gas into the plasma processing chamber enclosure, and a gas outlet for exhausting gas from the plasma processing chamber enclosure. A gas source is in fluid connection with the gas inlet. A controller is controllably connected to at least one of the gas source the electrode, the heater, the pressure regulator, the gas inlet, and the gas outlet.

These and other features of the present invention will be described in more details below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1A:
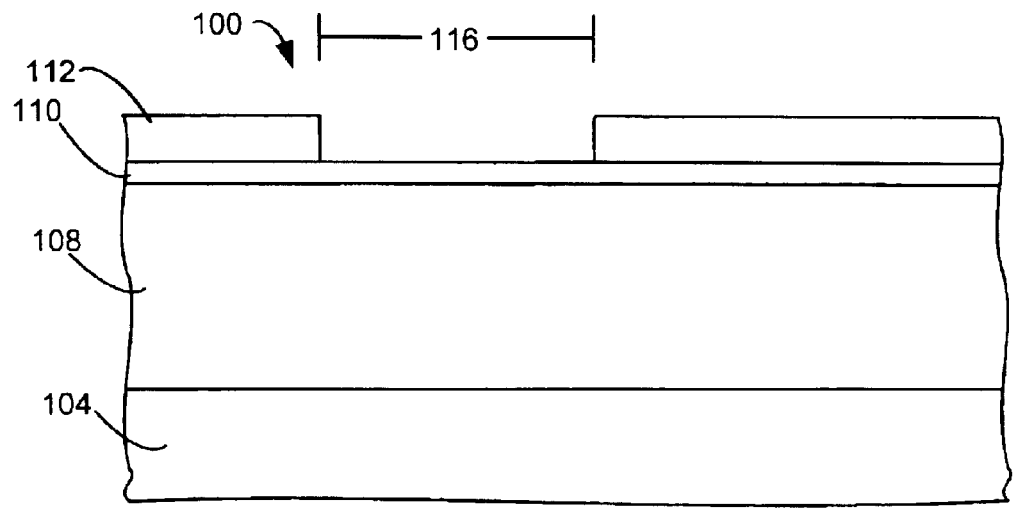
FIGS. 1A and 1B are cross sectional views of a trench etched into a dielectric layer according to the prior art.
Figure 1B:
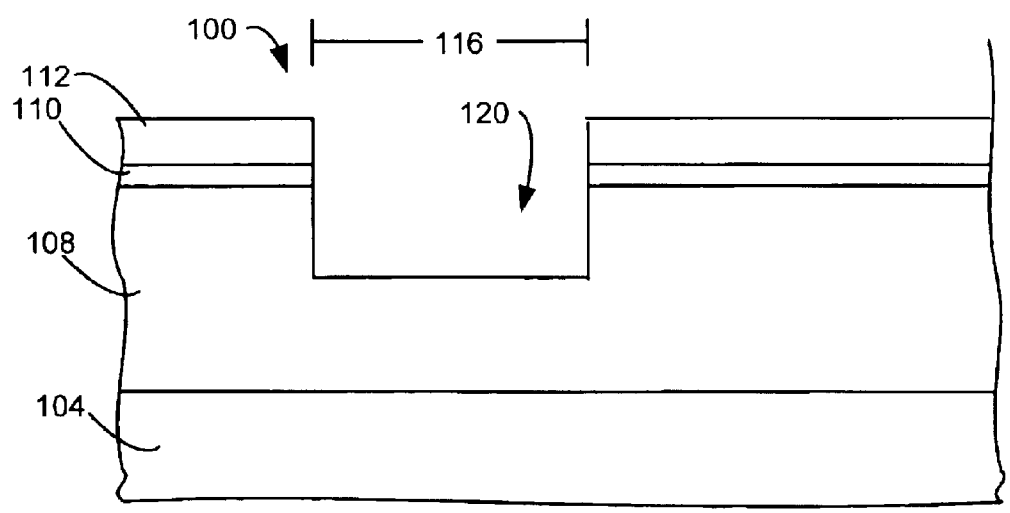
Figure 2:
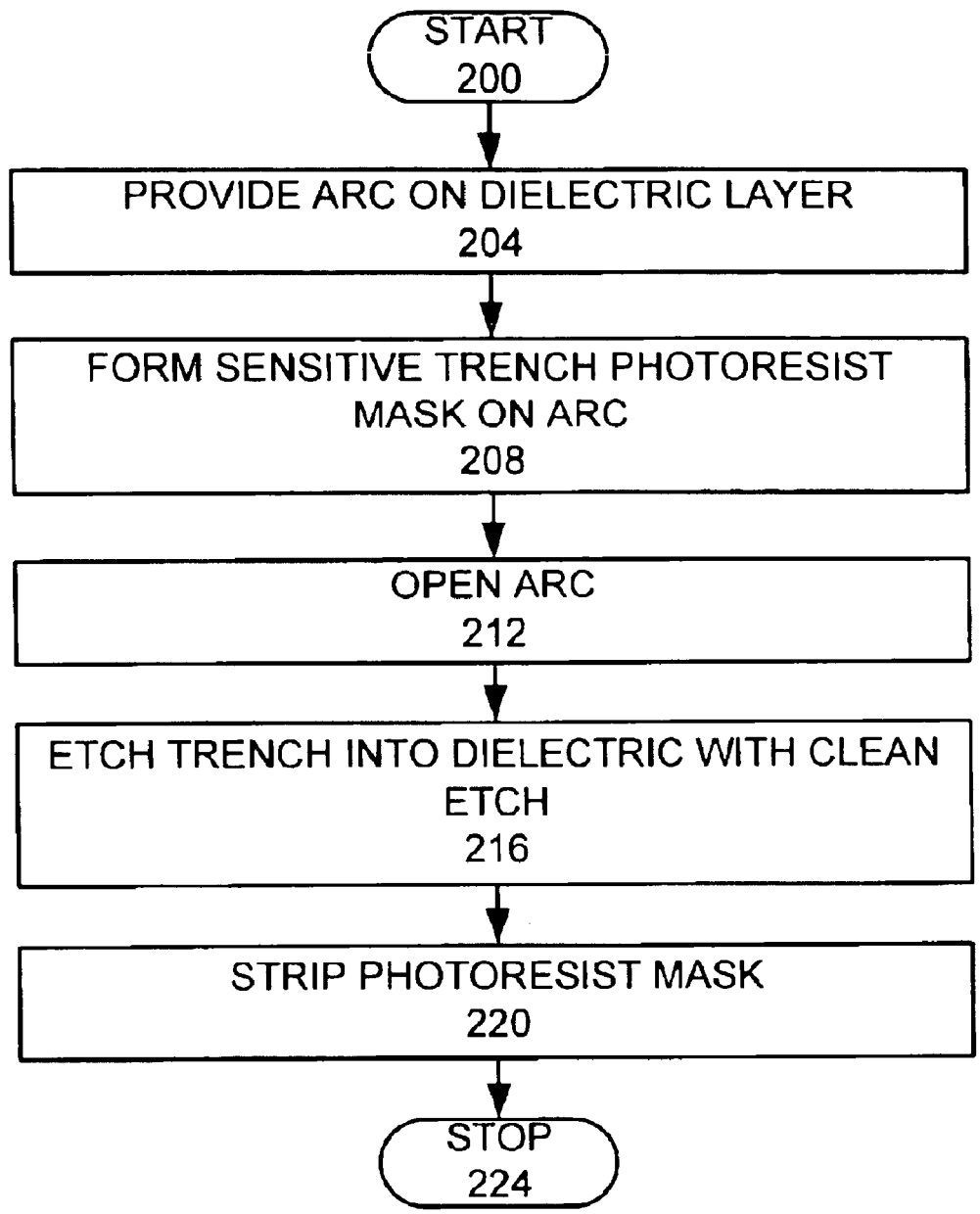
FIG. 2 is a flow chart of a process used in an embodiment of the invention.
Figure 3A:
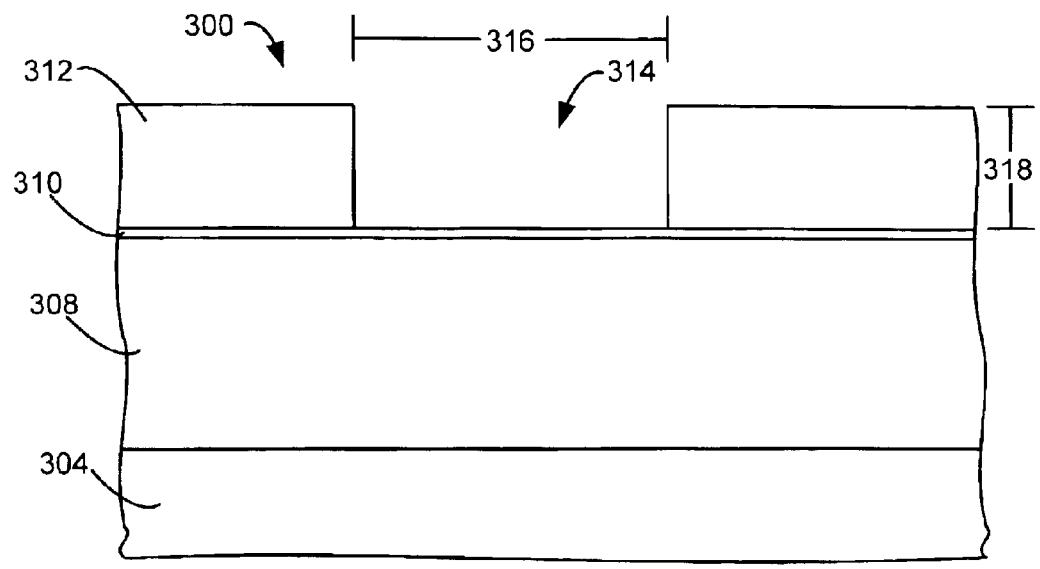
FIGS. 3A–3C are cross-sectional views of a trench etched according to an embodiment of the invention.

FIG. 2 is a flow chart of a process of forming a trench in a dielectric according to the invention. An ARC (Anti-Reflective Coating) is formed on a dielectric layer (step 204). FIG. 3A is an illustration of a cross-sectional view of a dielectric layer 308 over a substrate 304. An ARC 310 is provided on the dielectric layer 308, as shown. The ARC 310 may be an organic or inorganic ARC. The dielectric layer is a trench dielectric layer, in which a dual damascene trench is etched. Such a dielectric layer is not a hard mask layer.

A sensitive trench photoresist mask 312 is formed on the ARC 310 (step 208). A sensitive trench photoresist mask is a thin mask. In a preferred embodiment, the thin sensitive trench photoresist mask is between 2000 Å and 4000 Å. In a more preferred embodiment, the thin sensitive trench photoresist mask is between 2500 Å and 3000 Å. Sensitive photoresist materials are materials that are easily etched. Thin 193 nm photoresist and newer generation photoresist are considered sensitive photoresist materials. The trench pattern 314 has a width 316, as indicated. The photoresist has a thickness 318, as indicated. A sensitive trench photoresist mask provides such a thin mask of sensitive photoresist material, that without some added protection the trench etch would etch away the sensitive trench photoresist mask before the trench is etched to the desired depth.

Figure 3B:
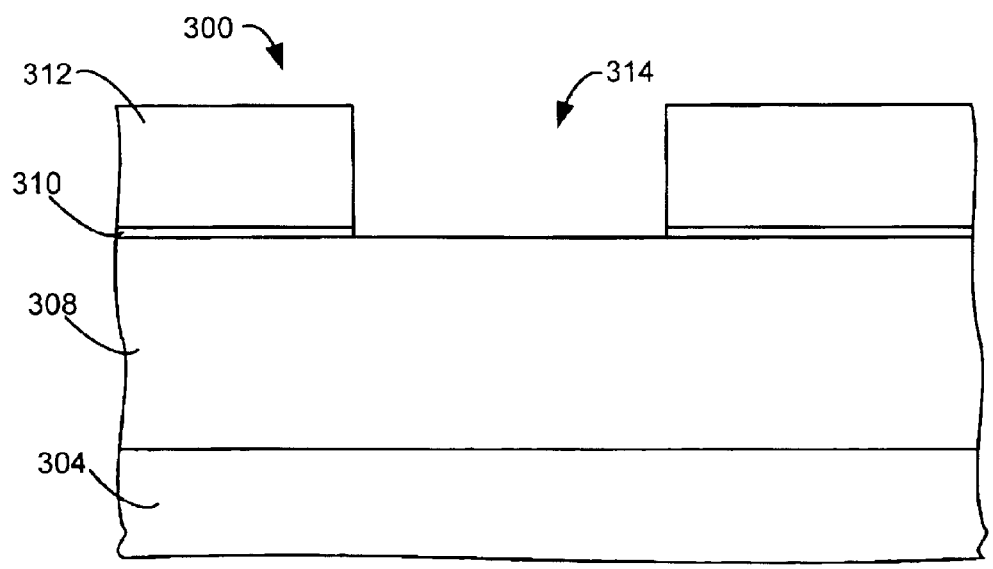

The ARC 310 is opened (step 212). A conventional ARC opening step may be used. FIG. 3B is an illustration of a cross-sectional view of the dielectric layer 308 over the substrate 304 after the ARC 310 has been opened.

Figure 3C:
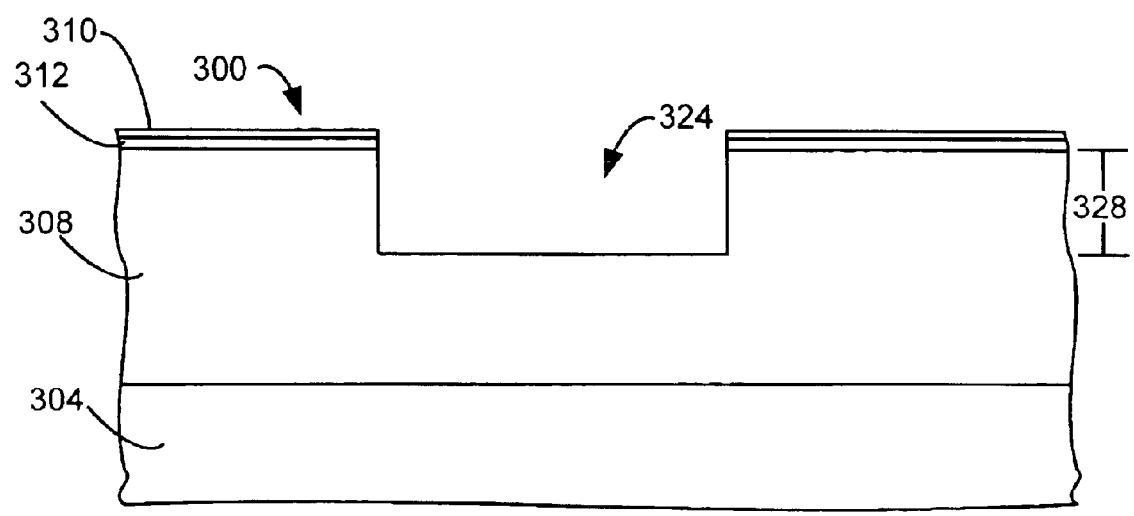

A trench is then etched into the dielectric layer with a clean etch (step 216). In a clean etch, heavy polymer forming gases make up less than 5% of the etchant gas, including any carrier gas. A clean etch most preferably would be a low polymerization process like one containing $CF_4$ or $C_2F_6$ as a principle gas. Other preferred embodiments may have $NF_3$ or $SF_6$ as principle component gases because of the high dissociation rate of Fluorine with these gases. Less preferred embodiments would be gases with a higher level of Carbon which presumably would decompose to molecules like CFx, which can bond with similar and form into longer MER chains. Examples of these gases include $C_4F_8$, $C_5F_8$, $C_4F_6$, of highly saturated hydrocarbon molecules like $CH_2F_2$, $CH_3F$, $C_2H_4$. More preferably, in a clean etch heavy polymer forming gases make up less than 2% of the etchant gas. Preferably, these gases keep the ratio of fluorine to polymer forming gas components to less at least 3:1. In the preferred embodiment of the invention, the trench etch has a low selectivity. More preferably, the trench etch selectivity of dielectric to photoresist of between about 1:1 and 2:1, where an etch selectivity of dielectric to photoresist of 2:1, means that the dielectric layer is etched twice as fast as the photoresist. FIG. 3C is a cross-sectional view of the dielectric layer 308 after the trench 324 has been etched. In the preferred embodiment, the trench is etched to a depth of between about 200 and 400 nm.

In the preferred embodiment, the photoresist is sensitive to an aggressive etch. Photoresist that is sensitive to an aggressive etch is photoresist that is etched as quickly by an aggressive etch as the dielectric layer, so that there is a low etch selectivity.

Figure 5:
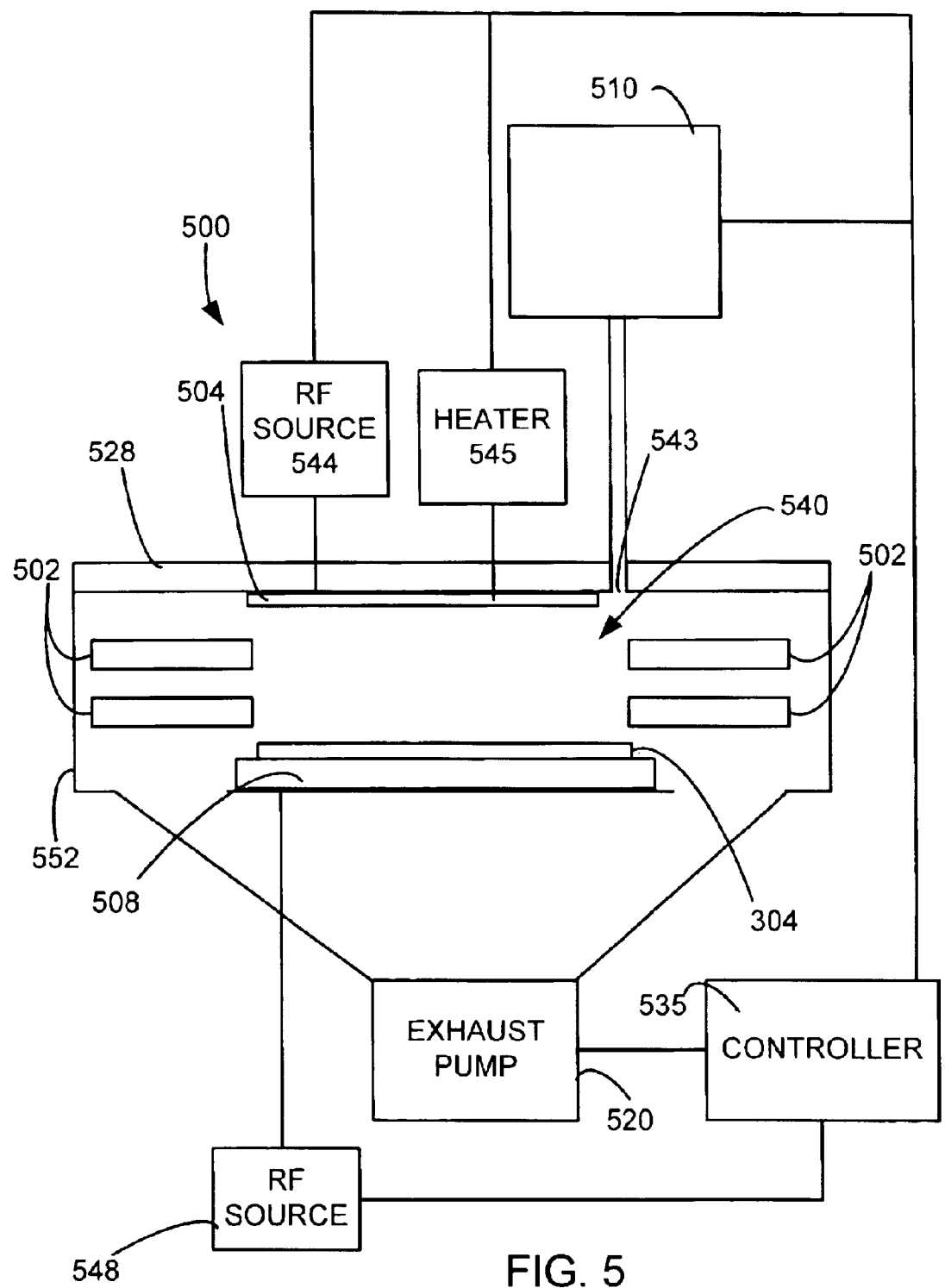
FIG. 5 is a schematic view of a process chamber that may be used in a preferred embodiment of the invention.

FIG. 5 is a schematic view of a process chamber 500 that may be used in the preferred embodiment of the invention. In this embodiment, the plasma processing chamber 500 comprises confinement rings 502, an upper electrode 504, a lower electrode 508, a gas source 510, and an exhaust pump 520. Within plasma processing chamber 500, the substrate wafer 304 is positioned upon the lower electrode 508. The lower electrode 508 incorporates a suitable substrate chucking mechanism (e.g., electrostatic, mechanical clamping, or the like) for supporting the substrate wafer 304. The reactor top 528 incorporates the upper electrode 504 disposed immediately opposite the lower electrode 508. The upper electrode 504, lower electrode 508, and confinement rings 502 define the confined plasma volume 540. Gas is supplied to the confined plasma volume by gas source 510 through a gas inlet 543 and is exhausted from the confined plasma volume through the confinement rings 502 and an exhaust port by the exhaust pump 520. The exhaust pump 520 forms a gas outlet for the plasma processing chamber. A first RF source 544 is electrically connected to the upper electrode 504. A second RF source 548 is electrically connected to the lower electrode 508. Chamber walls 552 define a plasma enclosure in which the confinement rings 502, the upper electrode 504, and the lower electrode 508 are disposed. In one embodiment, the second RF source 548 may comprise a 27 MHz power source and a 2 MHz power source, while the upper electrode 504 is grounded. Different combinations of connecting RF power to the electrodes are possible. A heater 545 is connected to the upper electrode and is able to heat the upper electrode.

A controller 535 is controllably connected to the first RF source 544, the second RF source 548, the exhaust pump 520, the heater 545 and the gas source 510. A showerhead may be connected to the gas inlet 543. The gas inlet 543 may be a single inlet for each gas source or a different inlet for each gas source or a plurality of inlets for each gas source or other possible combinations.

Figure 6A:
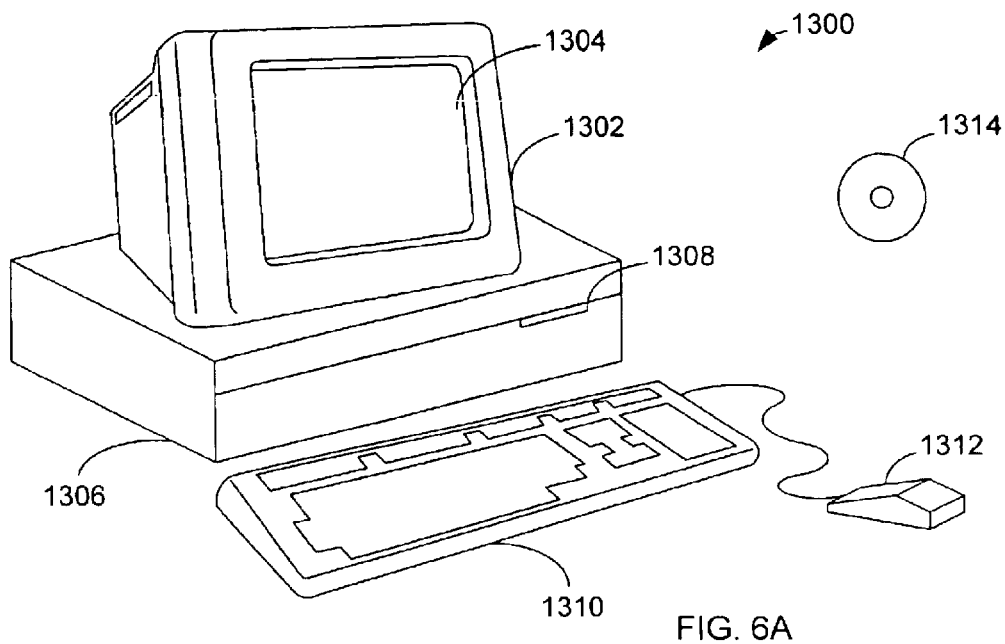
FIGS. 6A and 6B illustrate a computer system, which is suitable for implementing a controller.
Figure 6B:
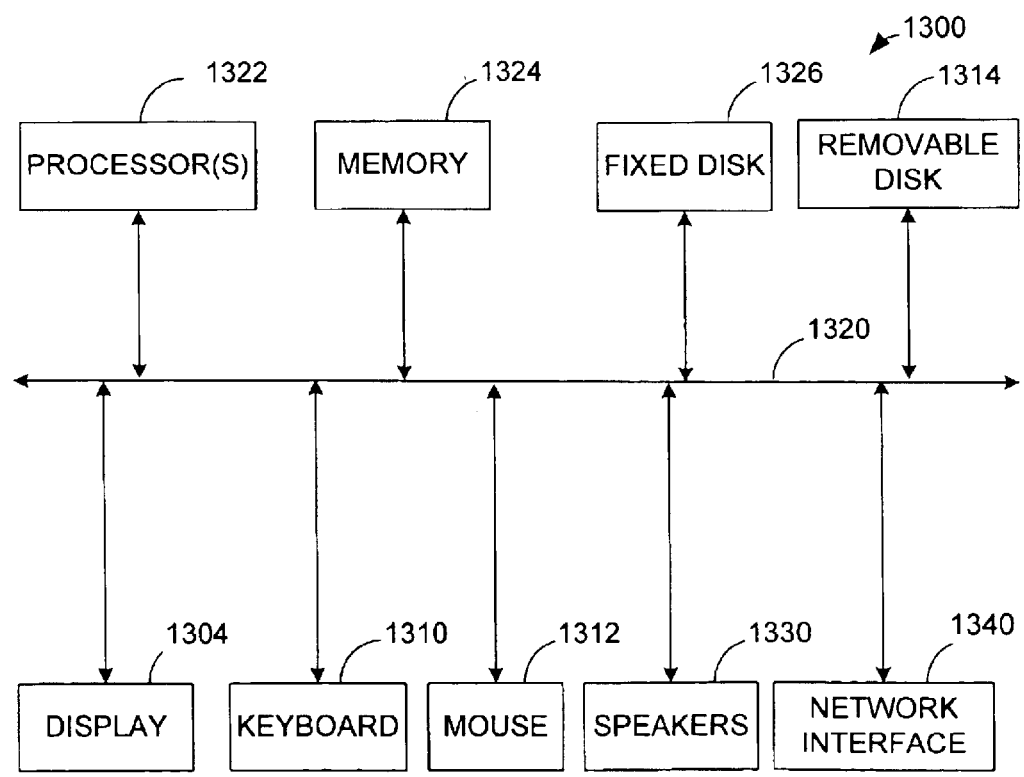

FIGS. 6A and 6B illustrate a computer system 800, which is suitable for implementing a controller 535 used in embodiments of the present invention. FIG. 6A shows one possible physical form of the computer system. Of course, the computer system may have many physical forms ranging from an integrated circuit, a printed circuit board, and a small handheld device up to a huge super computer. Computer system 800 includes a monitor 802, a display 804, a housing 806, a disk drive 808, a keyboard 810, and a mouse 812. Disk 814 is a computer-readable medium used to transfer data to and from computer system 800.

FIG. 6B is an example of a block diagram for computer system 800. Attached to system bus 820 is a wide variety of subsystems. Processor(s) 822 (also referred to as central processing units or CPUs) are coupled to storage devices, including memory 824. Memory 824 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 826 is also coupled bi-directionally to CPU 822; it provides additional data storage capacity and may also include any of the computer-readable media described below. Fixed disk 826 may be used to store programs, data, and the like and is typically a secondary storage medium (such as a hard disk) that is slower than primary storage. It will be appreciated that the information retained within fixed disk 826 may, in appropriate cases, be incorporated in standard fashion as virtual memory in memory 824. Removable disk 814 may take the form of any of the computer-readable media described below.

CPU 822 is also coupled to a variety of input/output devices, such as display 804, keyboard 810, mouse 812 and speakers 830. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 822 optionally may be coupled to another computer or telecommunications network using network interface 840. With such a network interface, it is contemplated that the CPU might receive information from the network, or might output information to the network in the course of performing the above-described method steps. Furthermore, method embodiments of the present invention may execute solely upon CPU 822 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 4A:
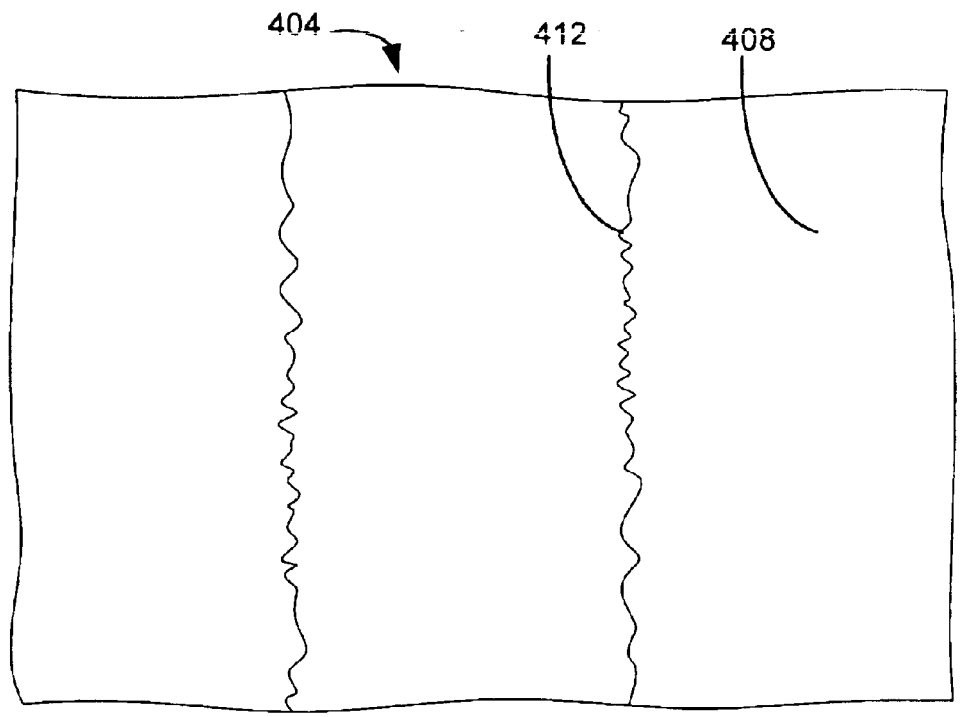
FIGS. 4A–4B are schematic illustrations of top views of etched trenches.
Figure 4B:
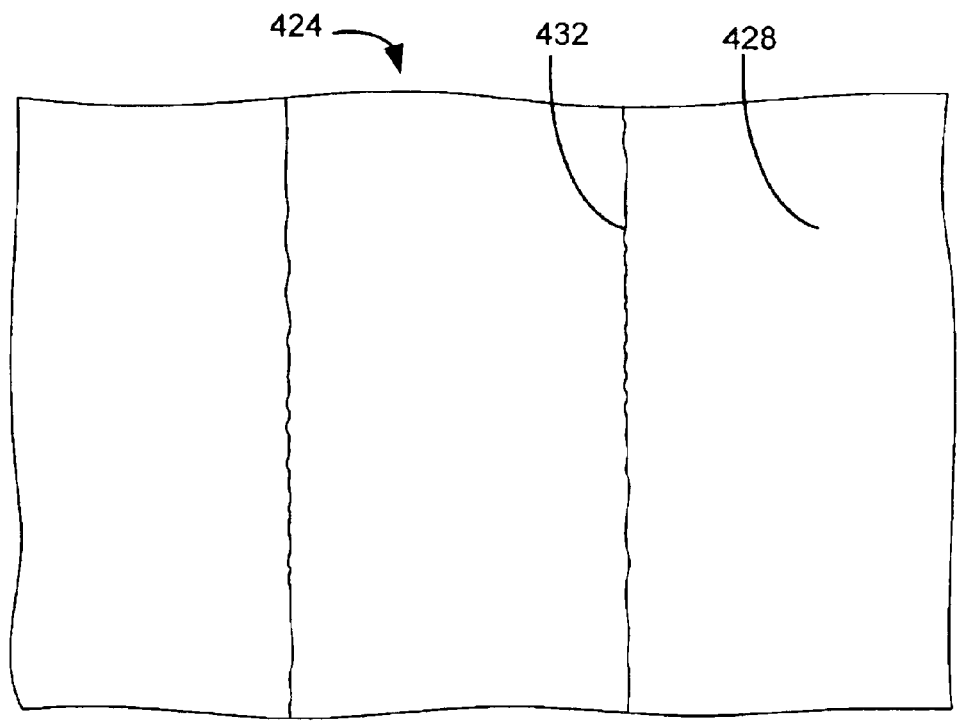

FIG. 4A is a schematic top view of a trench 404 etched into a dielectric layer 408. The walls 412 of the trench exhibit substantial line edge roughness. FIG. 4B is a schematic top view of a trench 424 etched into a dielectric layer 428. The walls 432 of the trench 424 exhibit less line edge roughness. In a paper by Calvin Gabriel published in 2003 at the ICMI conference the an industry standard for measuring line edge roughness is discussed as follows:

"The 2002 ITRS metrology roadmap [4] gives one definition for how to quantify LER: local line width variation (3s total, all frequency components included, both edges) evaluated along a distance equal to four times the technology node. Such a definition is easily programmed on the VeraSEM or NanoSEM: these tools measure a critical dimension by performing 32 or more line-scans across the feature of interest, with each line-scan spaced apart from the previous one by a small increment according to the measurement box defined by the user. The 3-sigma standard deviation of these scans follows the ITRS definition and is reported by the software as Sigma(B).

The ITRS definition, however, suffers under the "four technology nodes" requirement. For a 65 nm technology, this requires a box only 260 nm tall. Such a small length of the line scanned may not uncover low frequency LER, and the situation will grow worse as technology advances to 45 nm and 32 nm.

Therefore, line edge roughness may be quantified by measuring the width of the trench at a series of locations and averaging the variation over an interval, which is at least four times as long as the feature is wide. A Hitachi CD SEM measures 32 points over a 1 um box to measure line edge roughness. An Applied Materials NanoSEM measures 60 points over a 2 um rectangle. Calvin's paper showed no advantage to going above 2 um for small features but, some sensitivity was lost if you went below a 2 um box.

An approach to reduce line-edge roughness is to provide an etch with a dielectric to photoresist etch that is more selective than 4:1 by providing a heavy polymer forming gas. Such heavy polymer formers form a heavy polymer over the top of the photoresist to protect the photoresist, improving etch selectivity. Without wishing to be bound by theory, it is believed that such heavy polymers are sticky and provide stress on the photoresist mask that increases line edge roughness. It is also believed that reactions occurring within the photoresist increase roughening.

Line edge roughening may also be caused by mouse biting which is believed to be related to the stress, which is induced in the top of the PR layer by the deposited polymers from the plasma. So, the polymer, which protects the PR, can induce mechanical forces, which deform the mask and result in a rougher sidewall for thin PR. This phenomena is not typically observed in thick PR mask situations (>300 nm). It has been found that with 193 nm PR that $C_4F_6$ gas results in polymer, which can deposit more heavily then $CF_4$ or $C_4F_8$, but because of the deposition characteristics, striation in holes and roughness in trenches can result from modification of the PR mask. Also, roughening of the sidewall profile can cause micro-voids that follow the vertical plane. These can be caused by the break down of the photoresist integrity during the etch.

The invention reduces line edge roughness by reducing or eliminating heavy polymer formers that produce heavy polymers. Instead, cleaner component gases are used. Such cleaner component gases with a high fluorine to carbon ratio are most preferably $CF_4$, with Ar, but, more generally, may also include gases with a high F dissociation like $C_2F_6$, or gases, which have a high fluorine dissociation like $NF_3$ or $SF_6$. Addition of gases to aid in the dissociation of F can also provide benefit for LER. The addition of a small amount of $O_2$ (2–15 sccm) and/or a flow of $N_2$ (20–200 sccm) are known to aid in the creation of more free fluorine by binding with carbon components of the reactant gas. Under conventional etching processes, it is believed that such component gases would not form protective polymer over the photoresist to increase selectivity. The invention provides plasma parameters, such that these clean component gases form some protective polymer over the photoresist to increase etch selectivity, where the selectivity of the etch of the dielectric to photoresist is not increased above 2:1. Such techniques provide polymers that are not as sticky as heavy polymers and for which deposition location of such polymers may be more easily controlled. One technique that would be helpful in doing this is to increase the temperature of the upper electrode from 20° C. to at least 140° C. It is believed that polymer from the cleaner component gases would deposit on the upper electrode, causing less deposition on the photoresist. By increasing the upper electrode to at least 140° C., the deposition on the upper electrode is reduced, indirectly causing more deposition on the photoresist surface. The heater 545 helps to increase and control the upper electrode temperature to at least 70° C. In a preferred embodiment, the upper electrode temperature is increased to at least 70° C. during the etch. In a more preferred embodiment, the upper electrode temperature is increased to at least 90° C. In the most preferred embodiment, the upper electrode is increased to at least 140° C. The upper electrode is the electrode to which the substrate is not mounted and is placed opposite the substrate, the non-mounting electrode. If the substrate was mounted on the upper electrode, then the lower electrode would be the electrode one which the substrate is not mounted on and is opposite the substrate, so that the lower electrode is heated.

In addition, it has been found that providing higher power at high frequency (such as 27 MHz) creates a higher density plasma further increasing selectivity using clean etchants. In a preferred embodiment the high frequency power source provides a power of between 500 W and 2000 W. In a more preferred embodiment the high frequency power source provides a power between 500 W and 1200 W. In the most preferred embodiment the high frequency power source provides a power of between 500 W and 1000 W.

In addition, having a lower bias power, by providing less power to lower frequency RF (such as 2 MHz) reduces bombardment that increases selectivity. In a preferred embodiment the bias power source provides a power of between 0 W and 1000 W. In a more preferred embodiment the bias power source provides a power between 0 W and 600 W.

In addition, providing lower chamber pressure increases selectivity. For example, an 80 mTorr pressure has been found to be helpful. Therefore in a preferred embodiment a chamber pressure of between 60 mTorr and 400 mTorr. In a more preferred embodiment a chamber pressure between 70 mTorr and 300 mTorr is provided. In the most preferred embodiment, a chamber pressure of between 80 mTorr and 250 mTorr is provided.

Finally, some fine tuning of the process can be accomplished by further modification of the process to find a polymerization regime which maintains the overall CD while reducing the overall LER. The addition of gases, which are known to increase polymerization like $C_4F_8$, $CH_3F$, $H_2$, $CH2F2$, etc., can be added in small amounts to slow the erosion of the PR and help decrease LER slightly. For example, 5 sccm of C4F8 added to a very lean Ar/CF4/N2/O2 process reduced LER by ~10% in one case. $CHF_3$, $CH_2F_2$, $CH_3F$ or other hydrofluorcarbons can help but, the amount of gas needed would depend on the dissociation properties of the gas.

Therefore, this aspect of the invention controls where the polymer is deposited and provides a polymer from clean etchant gases, instead of increasing the total polymer deposited, even though the clean gases deposit with a low selectivity.

Preferably, the trench depth is kept to a minimum, while still providing sufficient electrical interconnections. One of the reasons, for this is that a thin trench depth allows for a thin photoresist mask, when the selectivity is low. A thin photoresist mask allows for better critical dimensions. In the preferred embodiment, the photoresist mask is thin enough to provide the same critical dimension as higher generation photoresist materials. This allows for improved critical dimensions without new and more expensive lithography and stepper systems. In addition, it is preferred that all or almost all of the photoresist is removed, so that just enough photoresist is used to provide the desired trench depth, to minimize CD.

For example, 248 nm photoresist may be used to form a stable photoresist mask if it is deposited to be 4000 Å thick. But a mask that thick can only be imaged to 0.2 nm. To increase resolution to image below 0.2 nm, the 248 photoresist mask is made thinner, for example 3200 Å thick. As mentioned above, the use of heavy polymer formers to increase selectivity to allow a thin photoresist mask to be used to etch a trench increases line edge roughness. Therefore, the invention uses cleaner polymer formers to increase selectivity to a point sufficient to etch a trench with reduced line edge roughness and yet have a selectivity of less than 2:1. The use of low selective chemistry will not be suitable to provide enough selectivity to ensure the barrier is not removed during the main etch, so an overetch with a higher selectivity is preferred for the final terminal steps of the etch.

EXAMPLES

Example 1

In one example of the invention, a 2500 Å silicon oxide layer is formed over a 300 Å silicon nitride etch stop, formed over a substrate. Two different silicon oxynitride (SION) layers are formed over the silicon oxide layer to form an ARC layer. In this example, one SiON layer was 285 Å and the other SiON layer was 300 Å. A 3200 Å patterned photoresist mask of 210 nm photoresist was formed over the ARC layer. The ARC layer is opened using a conventional ARC etch.

The silicon oxide layer is etched with the following recipe. The upper electrode is allowed to be heated above 140° C. The pressure is set to 180 mTorr. The 27 MHz RF source provides 800 Watts. The 2 MHz RF source provides 0 Watts. The etchant gas chemistry is 70 sccm $CF_4$, 100 sccm Ar, and 100 sccm $N_2$. The etch takes place for 32 seconds.

An over etch step completes the etching of the silicon oxide layer, but provides a greater selectivity with respect to the silicon nitride etch stop. The upper electrode is maintained at at lease 140° C. The pressure is set to 80 mTorr. The 27 MHz RF source provides 600 Watts. The 2 MHz RF source provides 600 Watts. The etchant gas chemistry is 7 sccm $C_4F_8$, 3 sccm $O_2$, 300 sccm Ar, and 100 sccm $N_2$. The etch takes place for 14 seconds. The over etch more selectively etches the silicon oxide with respect to the trench barrier and photoresist. The final depth of the trench from the etch and over etch is between about 260 nm and 300 nm deep. Therefore, a 320 nm thick photoresist layer is used to etch a trench less than 300 nm deep. In such a process, only half of the photoresist is removed during the etch.

The photoresist is removed using an ashing step. To provide the ashing in this example, the pressure is set to 400 mTorr. The 27 MHz RF source provides 400 Watts. The 2 MHz RF source provides 0 Watts. The etchant gas chemistry is 500 sccm $O_2$. The ashing takes place for 40 seconds.

The etch stop SiN layer is then opened. The pressure is set to 250 mTorr. The 27 MHz RF source provides 150 Watts. The 2 MHz RF source provides 150 Watts. The etchant gas chemistry is 90 sccm $CF_4$, 30 sccm $CHF_3$, 200 sccm Ar, and 200 sccm $N_2$. The opening takes place for 14 seconds.

Example 2

In a second example, the same substrate with the same silicon oxide layer, same ARC layer, and same patterned photoresist layer is used. The same opening process is used to open the ARC layer.

The silicon oxide layer is etched with the following recipe. The upper electrode is allowed to be heated above 140° C. The pressure is set to 180 mTorr. The 27 MHz RF source provides 800 Watts. The 2 MHz RF source provides 0 Watts. The etchant gas chemistry is 5 sccm $C_4F_8$, 70 sccm $CF_4$, 100 sccm Ar, and 100 sccm $N_2$. The etch takes place for 32 seconds to etch a trench between about 260 nm and 300 nm deep.

An over etch step completes the etching of the silicon oxide layer, but provides a greater selectivity with respect to the silicon nitride etch stop. The upper electrode is maintained at at lease 140° C. The pressure is set to 80 mTorr. The 27 MHz RF source provides 600 Watts. The 2 MHz RF source provides 600 Watts. The etchant gas chemistry is 7 sccm $C_4F_8$, 3 sccm $O_2$, 300 sccm Ar, and 100 sccm $N_2$. The etch takes place for 18 seconds.

The photoresist is removed using an ashing step. To provide the ashing in this example, the pressure is set to 400 mTorr. The 27 MHz RF source provides 400 Watts. The 2 MHz RF source provides 0 Watts. The etchant gas chemistry is 500 sccm $O_2$. The ashing takes place for 40 seconds.

The etch stop SiN layer is then opened. The pressure is set to 250 mTorr. The 27 MHz RF source provides 150 Watts. The 2 MHz RF source provides 150 Watts. The etchant gas chemistry is 90 sccm $CF_4$, 30 sccm $CHF_3$, 200 sccm Ar, and 200 sccm $N_2$. The opening takes place for 14 seconds.

The invention improves trench CD and line edge roughness. The more preferred embodiments are believed to reduce line-edge roughness more than the less preferred embodiments. These examples of the invention is able to provide a line edge roughness of 6–7 nm, where 32 measurements over a micron range are used to determine line edge roughness and where the photoresist mask may have an initial line edge roughness of 8–10 nm. Therefore, the invention may actually decrease line edge roughness compared to the original photoresist mask.

The invention is able to provide a feature width of between 0.11 to 0.14 microns using 90 nm node technology, which uses 248 nm or 193 nm photoresist.

The heater may not heat the upper electrode to 140° C. Instead the heater may heat the upper electrode to an intermediate temperature, such as 90° C., and then the etching process may add additional heat to heat the upper electrode to 140° C.

In other embodiments of the invention, the ARC is formed over the dielectric layer, so that the ARC is either on the dielectric layer or there are one or more layers between the ARC and dielectric layer. The ARC layer is provided to help the integrity of the lithography to help depth of focus on the bottom of the PR. The hardmask is used to perform a different designated task during the etch. A hard ARC (SiON) performs the same role as an Organic ARC for wafer patterning, the SiON may be used as a 'stop-indicator' during the Cu CMP step of metallization. A capping layer may be provided between the dielectric layer and the ARC to act as a diffusion barrier (i.e. such as a F diffusion barrier, since F can cause PR delamination on FSG) or a capping layer can provide a stronger layer to be more mechanically resistant to CMP, such as an Organic low k material with a TEOS or FSG cap. Such capping layers are desirable, if the dielectric is too 'soft' to stand up to mechanical polishing, thus requiring a tougher layer, sometimes a thin one, to maintain the structures integrity as etched.

While this invention has been described in terms of several preferred embodiments, there are alterations, permutations, modifications and various substitute equivalents, which fall within the scope of this invention. It should also be noted that there are many alternative ways of implementing the methods and apparatuses of the present invention. It is therefore intended that the following appended claims be interpreted as including all such alterations, permutations, modifications, and various substitute equivalents as fall within the true spirit and scope of the present invention.

What is claimed is:

1. A method for etching a trench to a trench depth in a dielectric layer over a substrate, comprising:
   applying an ARC over the dielectric layer,
   forming a photoresist mask on the ARC, wherein the photoresist mask has a thickness, wherein the forming the photoresist mask forms the photoresist mask to a thickness of between about 2000 Å and 4000 Å;
   etching through the ARC; and
   etching a trench into the dielectric layer with a dielectric to photoresist etch selectivity between 1:1 and 2:1.

2. The method, as recited in claim 1, wherein the forming the photoresist mask forms the photoresist mask of a 193 nm or newer generation photoresist.

3. The method, as recited in claim 1, wherein the photoresist mask is sensitive to aggressive etch chemistries with respect to line edge roughness control.

4. The method, as recited in claim 1, further comprising:
   placing the substrate into an etch chamber with an opposing electrode placed opposite the substrate; and
   heating the opposing electrode so that the opposing electrode reaches a temperature of at least 140° C. during the etching the trench into the dielectric layer.

5. The method, as recited in claim 1, wherein during the etching the trench the chamber pressure is maintained between about 60 mTorr and 400 mTorr.

6. The method, as recited in claim 1, wherein during the etching the trench a high frequency power source provides between 500 W and 2000 W.

7. The method, as recited in claim 1, wherein during the etching the trench a bias power source provides between 0 W and 1000 W.

8. The method, as recited in claim 1, wherein the etching the trench comprises providing an etchant gas selected from the group of $CF_4$, $C_2F_6$, $NF_3$, and $SF_6$.

9. The method, as recited in claim 8, wherein the etchant gas has less than 5% heavy polymer forming etchant gases.

10. A semiconductor device formed by the method according to claim 1.

11. A method for etching a trench to a trench depth in a dielectric layer over a substrate, comprising:
    applying an ARC on the dielectric layer;
    forming a sensitive photoresist mask on the ARC, with a thickness between about 2000 Å and 4000 Å;
    etching through the ARC; and
    etching a trench into the dielectric layer with a clean etch.

12. The method, as recited in claim 11, wherein the etch selectivity of dielectric to photoresist is between 1:1 and 2:1.

* * * * *